United States Patent [19]

Aoyama et al.

[11] Patent Number: 4,563,754

[45] Date of Patent: Jan. 7, 1986

[54] STATIC-TYPE RANDOM-ACCESS MEMORY DEVICE

[75] Inventors: Keizo Aoyama, Yamato; Takahiko Yamauchi; Teruo Seki, both of Kawasaki, all of Japan

[73] Assignee: Fujitsu Limited, Kawasaki, Japan

[21] Appl. No.: 480,582

[22] Filed: Mar. 30, 1983

[30] Foreign Application Priority Data

Mar. 31, 1982 [JP] Japan ................................. 57-51152

[51] Int. Cl.⁴ .............................................. G11C 7/00
[52] U.S. Cl. .................................... 365/190; 365/203
[58] Field of Search ................ 365/104, 190, 203, 222

[56] References Cited

U.S. PATENT DOCUMENTS

4,374,430  2/1983  Higuchi ............................... 365/104
4,379,346  4/1983  Ochii et al. ........................... 365/222
4,451,907  5/1984  Donoghue et al. .................. 365/203

Primary Examiner—Joseph A. Popek
Attorney, Agent, or Firm—Staas & Halsey

[57] ABSTRACT

A static-type RAM device in which the amplitude of the data signal stored in a memory cell just after the writing in of data is completed is increased and the stability of the data stored in each memory cell is increased. The RAM device includes a bit-line pulling-up circuit for pulling up the potential of a bit line to a voltage which is approximately equal to or larger than the power supply voltage and a word-line pulling-up circuit for pulling up the potential of a selected word line to a voltage which is larger than the power supply voltage after the writing in of data is completed.

15 Claims, 6 Drawing Figures

PRIOR ART

STATIC-TYPE RANDOM-ACCESS MEMORY DEVICE

BACKGROUND OF THE INVENTION (1) Field of the Invention

The present invention relates to a static-type random-access memory (RAM) device and more particularly to a static-type RAM device such as a metal-insulator semiconductor (MIS) memory device in which the amplitude of the data signal in a memory cell just after the writing of data thereinto is completed is increased and the stability of the data stored in the memory cell is increased.

(2) Description of the Prior Art

In a semiconductor memory device, it is possible for the data stored in each memory cell to sometimes be destroyed due to the irradiation of alpha rays thereinto or due to the application of noises thereto. The destruction of data occurs more frequently when the amplitude of the data stored in each memory cell, i.e., the voltage difference between the high level portion and the low level portion of each memory cell, is small. Therefore, it is necessary to increase the amplitude of the data stored in each memory cell as much as possible although the potential of the power source is limited to a predetermined value.

Figure 1:
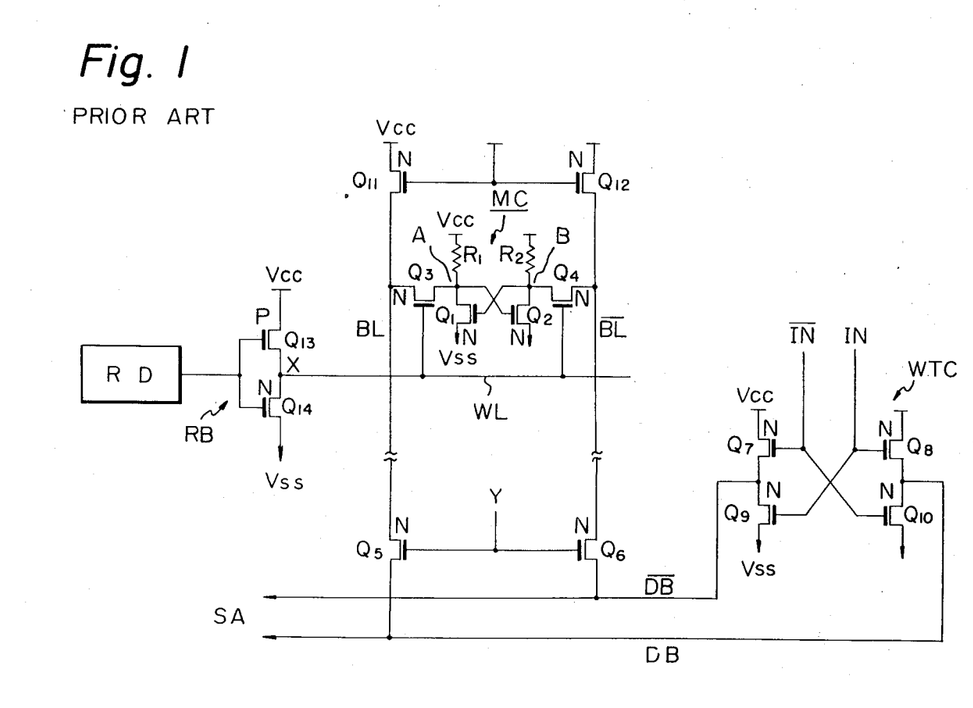
FIG. 1 is a block circuit diagram of a conventional MIS static-type RAM device.

FIG. 1 is a circuit diagram of a conventional static-type RAM device (hereinafter referred to as a static RAM device). In FIG. 1, MC is a memory cell composed of four MIS transistors $Q_1$ through $Q_4$ and two resistors $R_1$ and $R_2$. BL and $\overline{BL}$ are bit lines, WL is a word line, and DB and $\overline{DB}$ are data buses. $Q_5$ and $Q_6$ are transistors constituting column-selecting transfer gates connected between the bit lines BL and $\overline{BL}$ and the data buses DB and $\overline{DB}$, respectively. $Q_{11}$ and $Q_{12}$ are load transistors connected between the bit lines BL and $\overline{BL}$ and a power source $V_{cc}$, and $Q_7$ through $Q_{10}$ are transistors constituting a write-in circuit WTC. RD is a row decoder, and RB is a row driver composed of transistors $Q_{13}$ and $Q_{14}$. One end of each of the data buses DB and $\overline{DB}$ is connected to a sense amplifier SA (not shown in the drawing). In FIG. 1, only one memory cell MC, only one pair of bit lines BL and $\overline{BL}$, and only one word line WL are illustrated. In practice, however, a plurality of memory cells, bit line pairs, and word lines are arranged.

Figure 2:
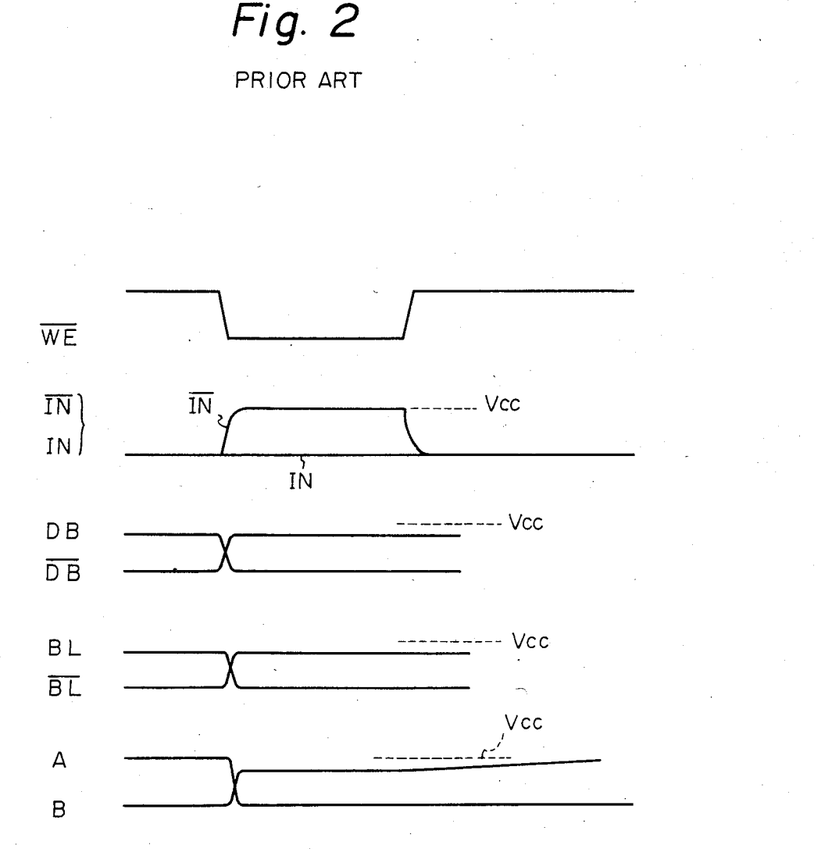
FIG. 2 is a waveform diagram of the operation of the static-type RAM device of FIG. 1.

In the static RAM device of FIG. 1, when data is written into the memory cell MC, a row-selecting signal X having a high potential level obtained by inverting and amplifying the output of the row decoder RD, is applied to the word line WL, and a column-selecting signal Y having a high potential level is applied to the gate electrodes of the column-selecting transistors $Q_5$ and $Q_6$ by a column decoder (not shown). Thus, the transistors $Q_3$ and $Q_4$ of the memory cell MC and the column-selecting transistors $Q_5$ and $Q_6$ are all turned on. Therefore, the data buses DB and $\overline{DB}$ and the bit lines BL and $\overline{BL}$ are connected, respectively, and the bit lines BL and $\overline{BL}$ and the nodes A and B of the memory cell MC are connected, respectively. In this condition, a write-enable signal $\overline{WE}$ is rendered low, and write-in signals IN and $\overline{IN}$ are rendered, for example, low and high, respectively, and are applied to the write-in circuit WTC. In this condition, the transistors $Q_7$ and $Q_{10}$ of the write-in circuit WTC are turned on and the transistors $Q_8$ and $Q_{10}$ thereof are turned on, thereby rendering the potentials of the data buses $\overline{DB}$ and DB high and low, respectively, and rendering the potentials of the bit lines $\overline{BL}$ and BL high and low, respectively. Therefore, the transistor $Q_1$ of the memory cell MC is turned on and the transistor $Q_2$ of the memory cell MC is turned off, with the result that the potentials of the nodes A and B of the memory cell MC become low and high, respectively. FIG. 2 illustrates the waveforms at the signals of each node when the data "1" or "0", which is opposite to the data "0" or "1" which is initially stored in the memory cell MC, is written into the memory cell.

The potential of the high level portion of the memory cell into which the information has just been written, i.e., the potential of the above-mentioned node B, becomes lower than the power supply voltage $V_{cc}$. As is illustrated in FIG. 2, when the write-in signal $\overline{IN}$ changes from a low level potential to a high level potential which is approximately equal to the power supply voltage $V_{cc}$, the potential of the data bus $\overline{DB}$ rises from a low level potential to the potential $V_{cc}-V_{th}(Q_7)$, i.e., the potential which is attained by subtracting the threshold voltage $V_{th}(Q_7)$ of the transistor $Q_7$ from the power supply voltage $V_{cc}$. The potential of the bit line $\overline{BL}$ becomes $V_{cc}-V_{th}(Q_6)$ when the threshold voltage $V_{th}(Q_6)$ of the transistor $Q_6$ is larger than the threshold voltage $V_{th}(Q_7)$ and becomes $V_{cc}-V_{th}(Q_7)$ when $V_{th}(Q_6)$ is smaller than $V_{th}(Q_7)$. Therefore, the potential $V_B$ of the above-mentioned node B becomes $$V_B = V_{cc} - V_{th}(Q_4, Q_6, Q_7)$$

where $V_{th}(Q_4, Q_6, Q_7)$ is the largest threshold voltage among the threshold voltages $V_{th}(Q_4)$, $V_{th}(Q_6)$, and $V_{th}(Q_7)$ of the transistors $Q_4$, $Q_6$, and $Q_7$, and it is assumed that the potentials of the high level signals of the word line WL, the write-in signals IN and $\overline{IN}$, and the column-selecting signal Y all rise to approximately the power supply voltage $V_{cc}$.

The potential $V_B$ of the node B, i.e., the node of the memory cell which is rendered high by the above-mentioned write-in operation, rises toward the power supply voltage $V_{cc}$ by the time constant R·C after the write-in operation is finished due to the supply of electric charges through the load resistor $R_2$ of the memory cell. In this case, $R=R_1=R_2$, and C is the stray capacitance of the node B. In a recent static RAM device, since the value of the resistance R is determined to be on the order of more than a gigohm in order to decrease power consumption, the time constant R·C is relatively large. Therefore, in the above-mentioned conventional static RAM device, the time interval from the completion of the writing of data into the memory cell to the time when the potential of the high level portion of the memory cell is almost equal to the power supply voltage $V_{cc}$ becomes long. Thus, in the conventional static RAM device, the stored data is often destroyed by external noises, alpha rays, and so on which are irradiated into the memory cell during the above-mentioned time interval.

SUMMARY OF THE INVENTION

In order to eliminate the above-mentioned problems of the conventional RAM device, in the present invention the potential of the word line in a static RAM device is temporarily pulled up to a potential level greater than the power supply voltage just after data is written into a memory cell.

It is an object of the present invention to increase the voltage level of a data signal written into a memory cell and to prevent destruction of the data stored in the memory cell as a result of external noises and so on.

According to the present invention, this object is attained by providing a static-type RAM device having static-type memory cells disposed at the intersecting portions of bit line pairs and word lines and including a bit-line pulling-up means for pulling up the potential of one of the bit lines of a selected bit line pair to a voltage which is approximately equal to a power supply voltage or which is larger than the power supply voltage and a word-line pulling-up meas for pulling up the potential of a selected word line to a voltage which is higher than the power supply voltage after data is written into a memory cell.

DESCRIPTION OF THE PREFERRED EMBODIMENTS

Figure 3:
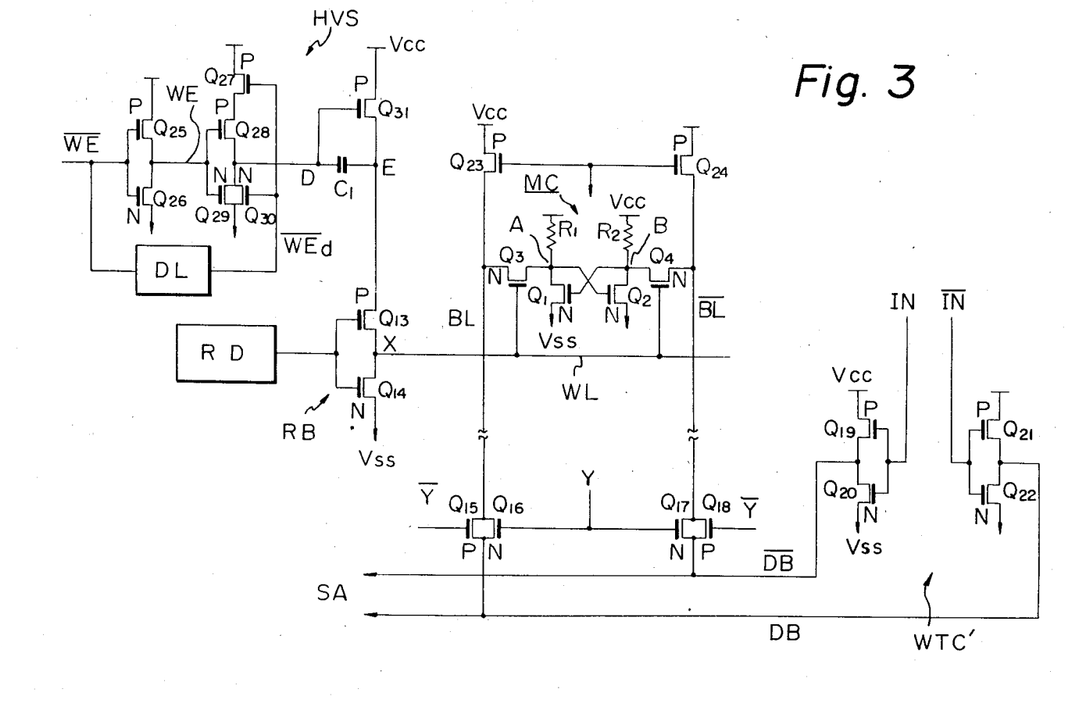
FIG. 3 is a block circuit diagram of a MIS static-type RAM device as an embodiment according to the present invention.

The embodiments of the present invention will now be explained with reference to the drawings. FIG. 3 is a circuit diagram of a MIS static-type RAM device as an embodiment of the present invention. The static-type RAM device of FIG. 3 differs from the device of FIG. 1 in that, in the RAM device of FIG. 3, there is provided a high-voltage supplying circuit HVS which supplies power to row drivers RB connected to row decoders, transfer gates for selecting a column are connected between bit lines BL, $\overline{BL}$ and data buses DB, $\overline{DB}$ are constituted of parallel connections of a P-type transistor $Q_{15}$ and an N-type transistor $Q_{16}$ and a P-type transistor $Q_{18}$ and an N-type transistor $Q_{17}$, load transistors $Q_{23}$ and $Q_{24}$ of the bit lines BL and $\overline{BL}$ are P-type transistors, and a write-in circuit WTC' comprises complementary metal-insulator semiconductor (MIS)-type inverters. The high-voltage supplying circuit HVS comprises transistors $Q_{25}$ through $Q_{31}$, a capacitor $C_1$, and a delay circuit DL.

Figure 4:
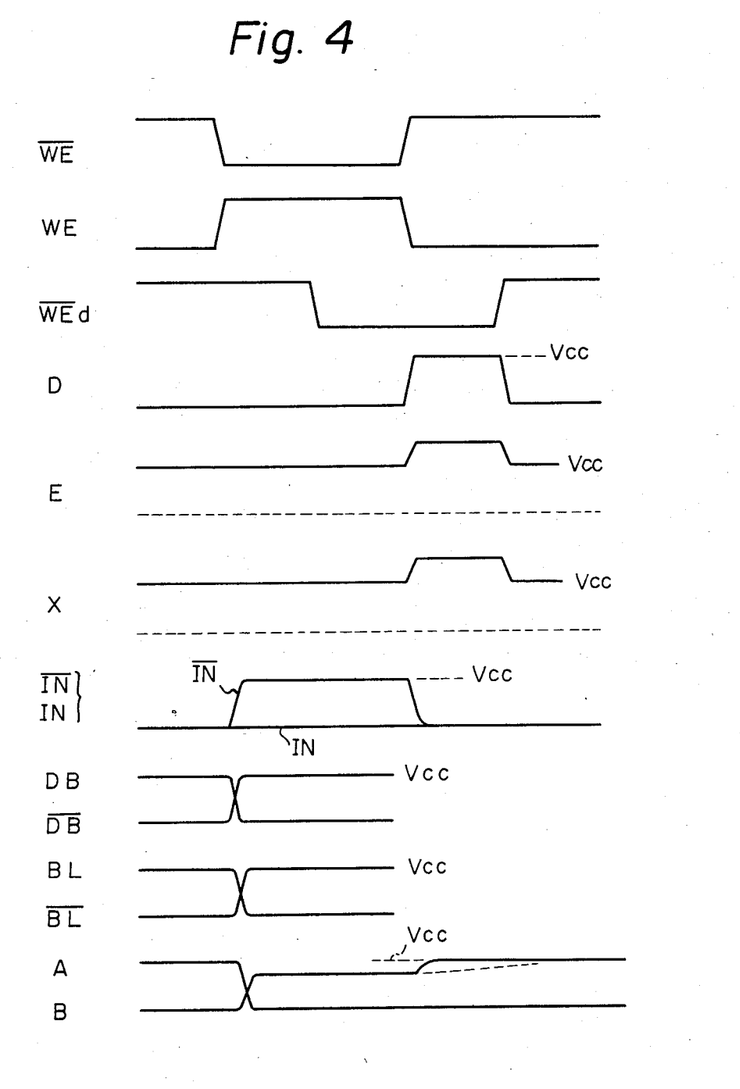
FIG. 4 is a waveform diagram of the operation of the static-type RAM device of FIG. 3.

In the static-type RAM device of FIG. 3, when data is written into a memory cell MC, a row-selecting signal X having a high potential level and which is an inverted signal of the output of a row decoder RD, is applied to a word line WL. At the same time, a column-selecting signal Y having a high potential level is applied to the N-type MIS transistors $Q_{16}$ and $Q_{17}$ and an inverted signal $\overline{Y}$ of the column-selecting signal Y is applied to the P-type transistors $Q_{15}$ and $Q_{18}$ in order to turn on the transfer gates so that a column is selected by a column decoder, etc. (not shown). A write-enable signal $\overline{WE}$ is rendered low, and write-in signals IN and $\overline{IN}$ are rendered low and high, respectively, and are applied to the write-in circuit WTC'. In this condition, the P-type transister $Q_{19}$ is turned on by the write-in signal IN, which has a low potential level, and the potential of the data bus $\overline{DB}$ is pulled up to approximately the power supply voltage $V_{cc}$, as is illustrated in FIG. 4. Since each of the transfer gates for selecting columns comprises a parallel connection of a P-type transistor and an N-type transistor and since each of the load transistors $Q_{23}$ and $Q_{24}$ is a P-type transistor, the potential of the bit line $\overline{BL}$ is also pulled up to approximately the power supply voltage $V_{cc}$.

The inverted write-enable signal $\overline{WE}$ applied to the high-voltage supplying circuit HVS is inverted by a CMIS inverter comprising the transistors $Q_{25}$ and $Q_{26}$, and thereby the write-enable signal WE is produced and applied to the transistors $Q_{28}$ and $Q_{29}$. The inverted write-enable signal $\overline{WE}$ is delayed for a predetermined length of time by the delay circuit DL, which outputs a delayed signal $\overline{WE}_d$ applied to the transistors $Q_{27}$ and $Q_{30}$. The transistors $Q_{27}$ through $Q_{30}$ comprise a NOR gate whose output (point D) becomes high only when both the write-enable signal $\overline{WE}$ and the delayed signal $\overline{WE}_d$ are low because the transistors $Q_{27}$ and $Q_{28}$ are turned on and the transistors $Q_{29}$ and $Q_{30}$ are turned off in this condition. Therefore, when the inverted write-enable signal $\overline{WE}$ becomes high again, a pulse signal is generated at the point D, which has a time width corresponding to the delay time of the delay circuit DL. The transistor $Q_{31}$ and capacitor $C_1$ form a clamping circuit. The transistor $Q_{31}$ is turned on when the potential of the point D is low and charges the capacitor $C_1$ so that the potential difference of the terminals thereof becomes approximately $V_{cc}$. Therefore, when the potential of the point D becomes high, the transistor $Q_{31}$ is turned off and a voltage, which is the sum of the potential of the point D and the voltage charge of the capacitor $C_1$, i.e., a voltage which is higher than or equal to the power supply voltage $V_{cc}$, is generated at a point E and is supplied to the row driver RB. Consequently, the potential X of the word line WL is temporarily pulled up to a potential level which is greater than or equal to the power supply voltage $V_{cc}$ after the writing in of data is completed. In this condition, since the potential of the bit line $\overline{BL}$ is pulled up to approximately the power supply voltage $V_{cc}$, as was mentioned before, the potential of the node B in the memory cell MC is rapidly pulled up to approximately the power supply voltage $V_{cc}$ after the writing in of data is completed, thereby decreasing the possibility of destruction of the stored data by external noises and so on.

Figures 5A, 5B:
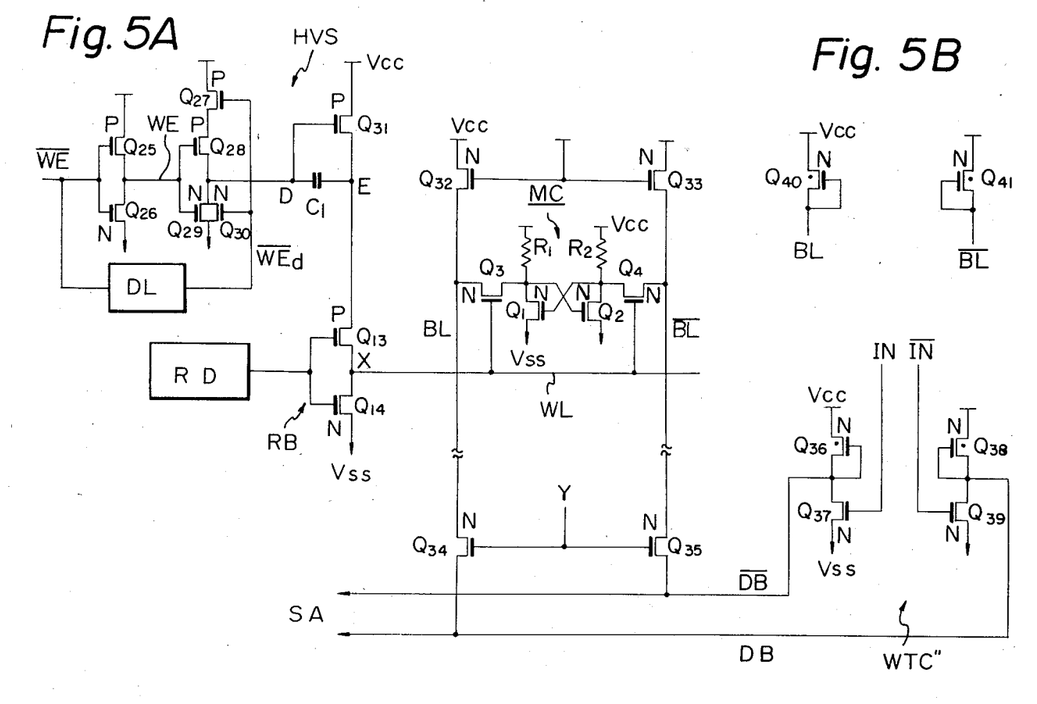
FIGS. 5A and 5B are block circuit diagrams of other embodiments according to the present invention.

FIG. 5A is a MIS static-type RAM device which is another embodiment of the present invention. In the static-type RAM device of FIG. 5A, load transistor $Q_{32}$ and $Q_{33}$ of the bit lines BL and $\overline{BL}$ and transistors $Q_{34}$ and $Q_{35}$ of the transfer gates for selecting a column comprise N-type transistors each having a smaller threshold voltage than other enhancement transistors used in the RAM device and a write-in circuit WTC" comprise two inverter circuits each having a depletion-type load transistor $Q_{36}$ or $Q_{38}$, thereby pulling up the potential of the high level voltage of a bit line to approximately the power supply voltage $V_{cc}$. The other portions of the device of FIG. 5A are the same as those of FIG. 3.

It is also possible to replace the load transistors $Q_{32}$ and $Q_{33}$ of the bit lines BL and $\overline{BL}$ shown in FIG. 5A with depletion-type transistors $Q_{40}$ and $Q_{41}$, as is illustrated in FIG. 5B.

As was mentioned above, according to the present invention, since the potential of the high level point of a memory cell is pulled up to approximately the power supply voltage $V_{cc}$ just after the writing in of data is completed, the possibility of destruction of stored data in each memory cell by external noises, the irradiation of alpha rays, and so on, is decreased, thereby making it possible to obtain a memory device having a high reliability.

We claim:

1. A static-type RAM device having static-type memory cells disposed at the intersecting portions of bit line pairs and word lines, operatively connected to a power supply source which supplies a power supply voltage, writing data into a memory cell, a potential level of a memory cell being approximately equal to the potential of the power supply source, said static-type RAM device comprising:

bit-line pulling-up means, operatively connected to the bit line pairs, for pulling up the potential of one of the bit lines of a selected bit line pair to a voltage which is approximately greater than or equal to the power supply voltage; and word-line pulling-up means, operatively connected to the word lines, for pulling up the potential of a selected word line to a voltage which is greater than the power supply voltage after the data is written into the memory cell.

2. A RAM device according to claim 1, further comprising pairs of input terminals and pairs of data buses, the pairs of data buses respectively, operatively connected to the pairs of bit lines and the pairs of input terminals, wherein the memory cells are arranged in columns, wherein said bit-line pulling-up means comprises transfer gates, respectively, operatively connected between the pairs of bit lines and pairs of the data buses, for selecting a column of memory cells, and wherein each of said transfer gates comprising a parallel connection of a P-type MIS transistor and an N-type MIS transistor.

3. A RAM device according to claim 2, wherein said bit-line pulling-up means further comprises a write-in circuit having pairs of CMIS-type inverters, respectively operatively connected between the pairs of input terminals and pairs of data buses.

4. A RAM device according to claim 2, wherein said bit-line pulling-up means further comprises a write-in circuit having pairs of inverters, respectively operatively connected between the pairs of input terminals and the pairs of data buses, each of said inverters comprising:

an inverter transistor; and a depletion-type load transistor operatively connected to said inverter transistor.

5. A RAM device according to claim 1, further comprising pairs of data buses and enhancement type transistors, wherein said bit-line pulling-up means comprises pairs of transfer gates, respectively, operatively connected to the pairs of bit lines and the pairs of data buses, for selecting a column of memory cells, and wherein each of said transfer gates comprises a MIS transistor having a smaller threshold voltage than that of other enhancement-type transistors used in the memory device.

6. A RAM device according to claim 5, further comprising pairs of input terminals, wherein said bit-line pulling-up means further comprises a write-in circuit having pairs of CMIS-type inverters, respectively, operatively connected between the pairs of input terminals and the pairs of data buses.

7. A RAM device according to claim 5, further comprising pairs of input terminals, wherein said bit-line pulling-up means further comprises a write-in circuit having pairs of inverters, respectively, operatively connected between the pairs of input terminals and the pairs of data buses, and wherein each of said inverters comprises an inverter transistor operatively connected to one of the input terminals and a depletion-type load transistor operatively connected to said inverter transistor.

8. A RAM device according to claim 1, wherein said bit-line pulling-up means comprises a pair of bit line load transistors, each of which is connected between a bit line and the power supply voltage and each of which is a P-type MIS transistor.

9. A RAM device according to claim 1, wherein said bit-line pulling-up means comprises pairs of depletion-type MIS bit line load transistors, respectively, operatively connected between the pairs of bit lines and the power supply voltage.

10. A RAM device according to claim 1, further comprising row address driver circuits, wherein said word-line pulling-up means comprises a high-voltage supplying circuit, operatively connected to the row address driver circuits, for temporarily pulling-up the operating voltage of the row address driver circuits to a potential greater than the power supply voltage supplied to the RAM device after the writing in of data is completed.

11. A RAM device according to claim 10, wherein said high-voltage supplying circuit is operatively connected to receive a write-enable signal and comprises:

a delay circuit having a delay time, operatively connected to receive the write-enable signal, for delaying the write-enable signal;

a gate circuit having an output terminal, operatively connected to said delay circuit, for generating an output signal at the output terminal during a time interval corresponding to the delay time of said delay circuit after the write-enable signal has been received; and a clamping circuit, operatively connected to said gate circuit, for generating a voltage higher than the power supply voltage when said gate circuit generates the output signal.

12. A RAM device according to claim 11, wherein said high-voltage generating circuit further comprises an inverters, operatively connected to said gate circuit and operatively connected to receive the inverted write-enable signal, for inverting the inverted write-enable signal and supplying a non-inverted write-enable signal to said gate circuit.

13. A RAM device according to claim 12, wherein said write-enable signal delayed by said delay circuit is an inverted write-enable signal and said gate circuit is a NOR gate for receiving the non-inverted write-enable signal supplied by said inverter and the inverted write-enable signal delayed by said delay circuit.

14. A RAM device according to claim 11, wherein said clamping circuit comprises:

a MIS transistor having a drain operatively connected to the power supply voltage of the RAM device, having a source operatively connected to the row address driver circuit and having gate operatively connected to the output terminal of said gate circuit; and a capacitor operatively connected between the gate and source of said MIS transistor.

15. A static-type RAM device, operatively connected to a power supply source which supplies a power supply voltage, having static-type memory cells disposed at intersections of word lines and bit line pairs, and having data bus pairs intersecting the bit line pairs, for writing data into one of the memory cells, the potential level of a memory cell being approximately equal to the potential of the power supply source, comprising:

bit-line pulling-up means, operatively connected to the bit line pairs, for pulling-up the potential of one of the bit lines of the bit-line pairs to a voltage greater than or equal to the power supply voltage, said bit-line pulling-up means comprising:

transfer gates, respectively operatively connected to the bit line pairs and between the data bus pairs;

a write-in circuit operatively connected to the bit line pairs; and bit line load transistors, respectively, operatively connected to each other;

row address driver circuits operatively connected to the word lines;

word-line pulling-up means, operatively connected to the word lines, for pulling-up the potential of a selected word line to a voltage greater than or equal to the power supply voltage after data is written into one of the memory cells, comprising:

a high-voltage supply circuit, operatively connected to said row address driver circuits, for temporarily pulling-up the operating voltage of said row address driver circuits, to a potential greater than the power supply voltage after data is written into one of the memory cells, said high voltage supply circuit comprising:

a clamping circuit operatively connected to said row address driver circuits;

a gate circuit operatively connected to said clamping circuit;

a delay circuit operatively connected to said gate circuit; and an inverter operatively connected between said delay circuit and said gate circuit.

* * * * *

UNITED STATES PATENT AND TRADEMARK OFFICE
CERTIFICATE OF CORRECTION

PATENT NO. : 4,563,754
DATED      : JANUARY 7, 1986
INVENTOR(S): KEIZO AOYAMA ET AL.

It is certified that error appears in the above-identified patent and that said Letters Patent is hereby corrected as shown below:

```
Col. 2, line 7, "at" should be --of--; and
        line 7, "of" should be --at--.

Col. 5, line 11, before "writing" insert --for--;
        line 34, "comprising" should be --comprises--.

Col. 6, line 46, "inverters," should be --inverter,--.
```

Signed and Sealed this

Twenty-fifth Day of March 1986

[SEAL]

Attest:

DONALD J. QUIGG

Attesting Officer

Commissioner of Patents and Trademarks